United States Patent
Qi et al.

(10) Patent No.: US 11,462,929 B2
(45) Date of Patent: Oct. 4, 2022

(54) SYSTEMS AND METHODS FOR DIRECT ESTIMATION OF BATTERY PARAMETERS USING ONLY CHARGE/DISCHARGE CURVES

(71) Applicant: University of Washington, Seattle, WA (US)

(72) Inventors: Yanbo Qi, Seattle, WA (US); Suryanarayana Kolluri, Seattle, WA (US); Venkat Subramanian, Seattle, WA (US); Sung-Yuan Chen, Seattle, WA (US); Neal Dawson-Elli, Seattle, WA (US)

(73) Assignee: UNIVERSITY OF WASHINGTON, Seattle, WA (US)

( * ) Notice: Subject to any disclaimer, the term of this patent is extended or adjusted under 35 U.S.C. 154(b) by 1058 days.

(21) Appl. No.: 15/725,192

(22) Filed: Oct. 4, 2017

(65) Prior Publication Data

US 2018/0097396 A1 Apr. 5, 2018

Related U.S. Application Data

(60) Provisional application No. 62/404,064, filed on Oct. 4, 2016.

(51) Int. Cl.
*H02J 7/00* (2006.01)
*H01M 4/139* (2010.01)
(Continued)

(52) U.S. Cl.
CPC ........ *H02J 7/00716* (2020.01); *G01R 31/382* (2019.01); *G01R 31/396* (2019.01);
(Continued)

(58) Field of Classification Search
CPC .................................................... G01R 31/367
See application file for complete search history.

(56) References Cited

U.S. PATENT DOCUMENTS 7,373,264 B2    5/2008  Verbrugge et al.
7,646,166 B2 *  1/2010  Koch ............... H01M 10/441
                                                    320/104
(Continued)

FOREIGN PATENT DOCUMENTS

WO    2017/015396 A1    1/2017

OTHER PUBLICATIONS

Appiah, W.A., et al., "Design Optimization of $LiNi_{0.6}Co_{0.2}Mn_{0.2}O_2$/Graphite Lithium-Ion Cells Based on Simulation and Experimental Data," Journal of Power Sources 319:147-158, 2016.
(Continued)

*Primary Examiner* — Drew A Dunn
*Assistant Examiner* — Tynese V McDaniel
(74) *Attorney, Agent, or Firm* — Christensen O'Connor Johnson Kindness PLLC

(57) ABSTRACT

Electrochemical models for the lithium-ion battery are useful in predicting and controlling its performance. The values of the parameters in these models are vital to their accuracy. However, not all parameters can be measured precisely, especially when destructive methods are prohibited. In some embodiments of the present disclosure, a parameter estimation approach is used to estimate the open circuit potential of the positive electrode (Up) using piecewise linear approximation together with all the other parameters of a single particle model. Up and 10 more parameters may be estimated from a single discharge curve without knowledge of the electrode chemistry using a technique such as a genetic algorithm. Different case studies were presented for estimating Up with different types of parameters of the
(Continued)

battery model. The estimated parameters were then validated by comparing simulations at different discharge rates with experimental data.

12 Claims, 11 Drawing Sheets

(51) Int. Cl.
| | |
|---|---|
| H01M 10/0525 | (2010.01) |
| G01R 31/382 | (2019.01) |
| G01R 31/396 | (2019.01) |
| H01M 10/42 | (2006.01) |
| H01M 10/44 | (2006.01) |
| H01M 10/48 | (2006.01) |
| H01M 4/02 | (2006.01) |

(52) U.S. Cl.
CPC ....... *H01M 4/139* (2013.01); *H01M 10/0525* (2013.01); *H01M 10/425* (2013.01); *H01M 10/44* (2013.01); *H01M 10/48* (2013.01); *H01M 2004/028* (2013.01); *H01M 2010/4271* (2013.01); *H02J 7/0049* (2020.01)

(56) References Cited

U.S. PATENT DOCUMENTS

| | | | | |
|---|---|---|---|---|
| 8,332,342 | B1 | 12/2012 | Saha et al. | |
| 9,381,823 | B2* | 7/2016 | Lee | B60K 6/40 |
| 9,581,988 | B2* | 2/2017 | Lee | B60L 50/52 |
| 10,243,385 | B2* | 3/2019 | MirTabatabaei | H01M 10/425 |
| 10,353,008 | B2* | 7/2019 | Benosman | G01R 31/367 |
| 10,447,046 | B2* | 10/2019 | Ravi | H02J 13/0003 |
| 10,686,321 | B2* | 6/2020 | Ravi | H02J 7/0063 |
| 2011/0309838 | A1* | 12/2011 | Lin | G01R 31/367 |
| | | | | 324/427 |
| 2014/0312848 | A1* | 10/2014 | Alexander | H01M 10/633 |
| | | | | 320/134 |
| 2014/0350877 | A1 | 11/2014 | Chow et al. | |
| 2015/0155604 | A1* | 6/2015 | Fuchimoto | H01M 16/00 |
| | | | | 320/134 |
| 2015/0355283 | A1* | 12/2015 | Lee | G01R 31/3842 |
| | | | | 702/63 |
| 2016/0052419 | A1* | 2/2016 | Takahashi | H01M 10/48 |
| | | | | 429/61 |
| 2017/0176540 | A1* | 6/2017 | Omi | G01R 31/3842 |
| 2017/0222449 | A1* | 8/2017 | MirTabatabaei | G01R 31/382 |
| 2017/0242344 | A1* | 8/2017 | Carcasi | G03F 7/2004 |
| 2017/0288414 | A1* | 10/2017 | Klein | B60L 3/0046 |
| 2018/0045788 | A1* | 2/2018 | Kawai | H01M 10/482 |
| 2019/0162791 | A1* | 5/2019 | Farag | H01M 10/0525 |
| 2019/0195960 | A1* | 6/2019 | Koba | G01R 31/389 |
| 2021/0165047 | A1* | 6/2021 | Park | G01R 31/3835 |

OTHER PUBLICATIONS

"Batteries Carried by Airline Passengers: Frequently Asked Questions," Sep. 9, 2016, Federal Aviation Administration, Office of Hazardous Materials Safety, <http://www.faa.gov/Go/PackSafe> [retrieved May 15, 2019], 2 pages.

"Battery Fire Risk Goes Well Beyond Samsung," Sep. 2, 2016, CBS News, <https://www.cbsnews.com/news/lithium-battery-fire-risk-samsung-galaxy-note-7/> [retrieved May 15, 2019], 5 pages.

Botte, G.G., et al., "Mathematical Modeling of Secondary Lithium Batteries," Electrochimica Acta 45:2595-2609, 2000.

Fleischer, C., et al., "On-Line Adaptive Battery Impedance Parameter and State Estimation Considering Physical Principles in Reduced Order Equivalent Circuit Battery Models: Part 1. Requirements, Critical Review of Methods and Modeling," Journal of Power Sources 260:276-291, 2014.

Forman, J.C., et al., "Genetic Identification and Fisher Identifiability Analysis of the Doyle-Fuller-Newman Model From Experimental Cycling of a $LiFePO_4$ Cell," Journal of Power Sources 210:263-275, 2012.

Guo, Q., and R.E. White, "Cubic Spline Regression for the Open-Circuit Potential Curves of a Lithium-Ion Battery," Journal of the Electrochemical Society 152(2):A343-A350, 2005.

Jackey, R., et al., "Battery Model Parameter Estimation Using a Layered Technique: An Example Using a Lithium Iron Phosphate Cell," The MathWorks, Inc., Doc. No. 2013-01-1547, Technical paper presented at the 2013 SAE World Congress & Exhibition, Apr. 16-18, 2013, Detroit, 14 pages.

Lee, S., et al., "State-of-Charge and Capacity Estimation of Lithium-Ion Battery Using a New Open-Circuit Voltage Versus State-of-Charge," Journal of Power Sources 185:1367-1373, 2008.

Li, J., et al., "Parameter Identification of Lithium-Ion Batteries Model to Predict Discharge Behaviors Using Heuristic Algorithm," Journal of the Electrochemical Society 163(8):A1646-A1652, 2016.

Ramadass, P., et al., "Development of First Principles Capacity Fade Model for Li-Ion Cells," Journal of the Electrochemical Society 151(2):A196-A203, 2004.

Ramadesigan, V., et al., "Modeling and Simulation of Lithium-Ion Batteries From a Systems Engineering Perspective," Journal of the Electrochemical Society 159(3):R31-R45, 2012.

Ramadesigan, V., et al., "Parameter Estimation and Capacity Fade Analysis of Lithium-Ion Batteries Using Reformulated Models," Journal of the Electrochemical Society 158(9):A1048-A1054, 2011.

Sangwan, V., et al., "Estimation of Battery Parameters of the Equivalent Circuit Model Using Grey Wolf Optimization," Proceedings of the 2016 IEEE 6th International Conference on Power Systems (ICPS), Mar. 4-6, 2016, New Delhi, 6 pages.

Santhanagopalan, S., et al., "Parameter Estimation and Model Discrimination for a Lithium-Ion Cell," Journal of the Electrochemical Society 154(3):A198-A206, 2007.

Yu, P., et al., "Determination of the Lithium Ion Diffusion Coefficient in Graphite," Journal of the Electrochemical Society 146(1):8-14, 1999.

Zhang, D., et al., "Modeling Lithium Intercalation of a Single Spinel Particle Under Potentiodynamic Control," Journal of the Electrochemical Society 147(3):831-838, 2000.

Zhang, L., et al., "Multi-Objective Optimization of Lithium-Ion Battery Model Using Genetic Algorithm Approach," Journal of Power Sources 270:367-378, 2014.

* cited by examiner

SYSTEMS AND METHODS FOR DIRECT ESTIMATION OF BATTERY PARAMETERS USING ONLY CHARGE/DISCHARGE CURVES

CROSS-REFERENCE TO RELATED APPLICATION

This application claims the benefit of Provisional Application No. 62/404,064, filed Oct. 4, 2016, the entire disclosure of which is hereby incorporated by reference herein for all purposes.

STATEMENT OF GOVERNMENT LICENSE RIGHTS

This invention was made with Government support under Grant No. DE-AR0000275, awarded by the Department of Energy. The Government has certain rights in the invention.

BACKGROUND

Due to their high power and energy densities, lithium-ion batteries are emerging as one of the most popular energy storage technologies, both for consumer electronics like mobile phones, and for now ubiquitous electric vehicles and grid scale energy storage. All lithium-ion battery installations are accompanied with a control system called the Battery Management System (BMS). The role of a BMS is to ensure safe and reliable operation of the battery and to perform functions like current, voltage and temperature monitoring. Based on these monitored inputs together with a battery model, a BMS generates operating decisions for the battery, including depth of discharge, charging profile and so on. Compared with conventional empirical models used in the BMS, sophisticated physics-based models can describe the battery dynamics more accurately, thus are able to suggest optimal charging profiles that reduce degradation while allowing greater depth of discharge. However, the lack of accurate parameters needed for these models, typically the Single Particle Model (SPM), prevents their industry-wide adoption and general usage.

Precise values of the parameters are generally not known, as battery manufacturers treat them as trade secrets. Some parameters like the electrode thickness and particle size are not difficult to measure after opening up the cell, but require destructive testing. Some of the parameters are difficult to measure reliably. For example, lithium ion diffusivity evaluated by different techniques can differ dramatically. The lithium ion diffusion coefficient evaluated by potential intermittent titration technique (PITT) and Warburg impedance methods can be two orders of magnitude lower compared with EIS approach. Some parameters are almost impossible to measure experimentally even with time-consuming destructive methods. For example, Bruggeman coefficient and tortuosity cannot be measured directly, therefore usually require fitting the simulation results from the experimental data. The kinetic data on the insertion reactions are not available, because of the fast charge transfer and slow mass transfer in the system, thus is usually estimated. Furthermore, some parameters are function of battery configuration and usage, hence may vary from cell to cell and change during the battery's lifetime. The fact that battery parameters change with use, makes direct measuring almost impossible, when updating the 'instantaneous' battery parameters over time is required for more accurate battery monitoring and control. The ability to get real-time parameters without opening up the cell is also important as greater proliferation of Lithium-ion batteries creates huge secondary usage market, which can only aim to use the batteries effectively and safely if the 'instantaneous' battery parameters are known.

SUMMARY

This summary is provided to introduce a selection of concepts in a simplified form that are further described below in the Detailed Description. This summary is not intended to identify key features of the claimed subject matter, nor is it intended to be used as an aid in determining the scope of the claimed subject matter.

In some embodiments, a battery management system is provided. The system comprises a connector, a programmable chip, and a controller device. The connector is for electrically coupling a battery to the battery monitoring system. The programmable chip is configured to control charging and discharging of the battery. The controller device is configured to receive approximate values for one or more characteristics of the battery; determine at least one parameter for a model that predicts performance of the battery using the approximate values and a measured discharge curve for the battery, the at least one parameter including at least one thermodynamic parameter; and provide the at least one determined parameter to the programmable chip for controlling the charging and discharging of the battery.

In some embodiments, a method of controlling charging or discharging of a battery is provided. A controller device receives approximate values for one or more characteristics of the battery. The controller device determines at least one parameter for a model that predicts performance of the battery using the approximate values and a measured discharge curve for the battery, the at least one parameter including at least one thermodynamic parameter. The at least one determined parameter is provided to a programmable chip that controls charging and discharging of the battery.

In some embodiments, a non-transitory computer-readable medium having computer-executable instructions stored thereon is provided. The instructions, in response to execution by at least one processor of a controller device, cause the controller device to perform actions for controlling charging or discharging of a battery, the actions comprising receiving, by the controller device, approximate values for one or more characteristics of the battery; determining, by the controller device, at least one parameter for a model that predicts performance of the battery using the approximate values and a measured discharge curve for the battery, the at least one parameter including at least one thermodynamic parameter; and providing the at least one determined parameter to a programmable chip that controls charging and discharging of the battery.

DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein.

DETAILED DESCRIPTION

Realizing the importance of parameter estimation in electrochemical models, many researchers have been actively working on this topic. However, in literature no one has reported successful estimation of thermodynamics parameters, such as the open circuit potential (OCP) of a single electrode ($U_p$), nor has anyone attempted to get this information from a charge curve or discharge curve for the whole battery cell. Owing to the existence of multi-stage intercalation voltage plateaus, the OCP-SOC relationship cannot be predicted by the general Nernst equation. The conventional way of getting OCP information is by fitting a regression model to the experimental data measured at different state of charge (SOC). The OCP data is usually obtained by super slow discharge (at least 1/10 C, sometimes as low as 1/60 C and even 1/100 C) while measuring the potential vs. lithium metal as SOC changes. OCP is an intrinsic property of a certain material, thus needs to be determined every time when new electrode chemistry is used (e.g. NCM, LCO). The measurement is not only time consuming, but also destructive, as measurements need to be done for positive and negative electrode separately. Sometimes the experimental measurement can be spared if the chemistry of both electrodes is known and has been characterized, though the OCP-SOC relationship is not exactly the same for each individual cell even for the same materials fabricated with the same structures. This relationship also changes as battery ages, resulting in bigger discrepancy in battery simulation. Furthermore, there are times when detailed material information is inaccessible, especially for commercial cells. As an alternative way to obtain OCP, estimation based on model-experimental comparison can be useful in practice. In the present disclosure, we provide a methodology to estimate OCP of the positive electrode based on a single discharge curve.

The methodology described herein can be deployed on-site in field systems to estimate the battery parameters on the fly. This opens up the door for system integrators to pick any cell on the market and use it in the most efficient way, with just the information provided in the battery datasheet. Since this method has the potential to provide real-time parameter estimation during operation and does not require any destructive testing, the parameters can be updated every few cycles to reflect the change in the cell. It can also facilitate the usage of second-hand batteries, even when operating history was unavailable. The techniques disclosed herein also improve the accuracy of the battery model used for controlling charging and discharging of the battery, and so can increase battery life up to 100%, can decrease charging time, can allow the battery to be discharged farther by using a lower cutoff voltage, and have other benefits.

Figure 1:
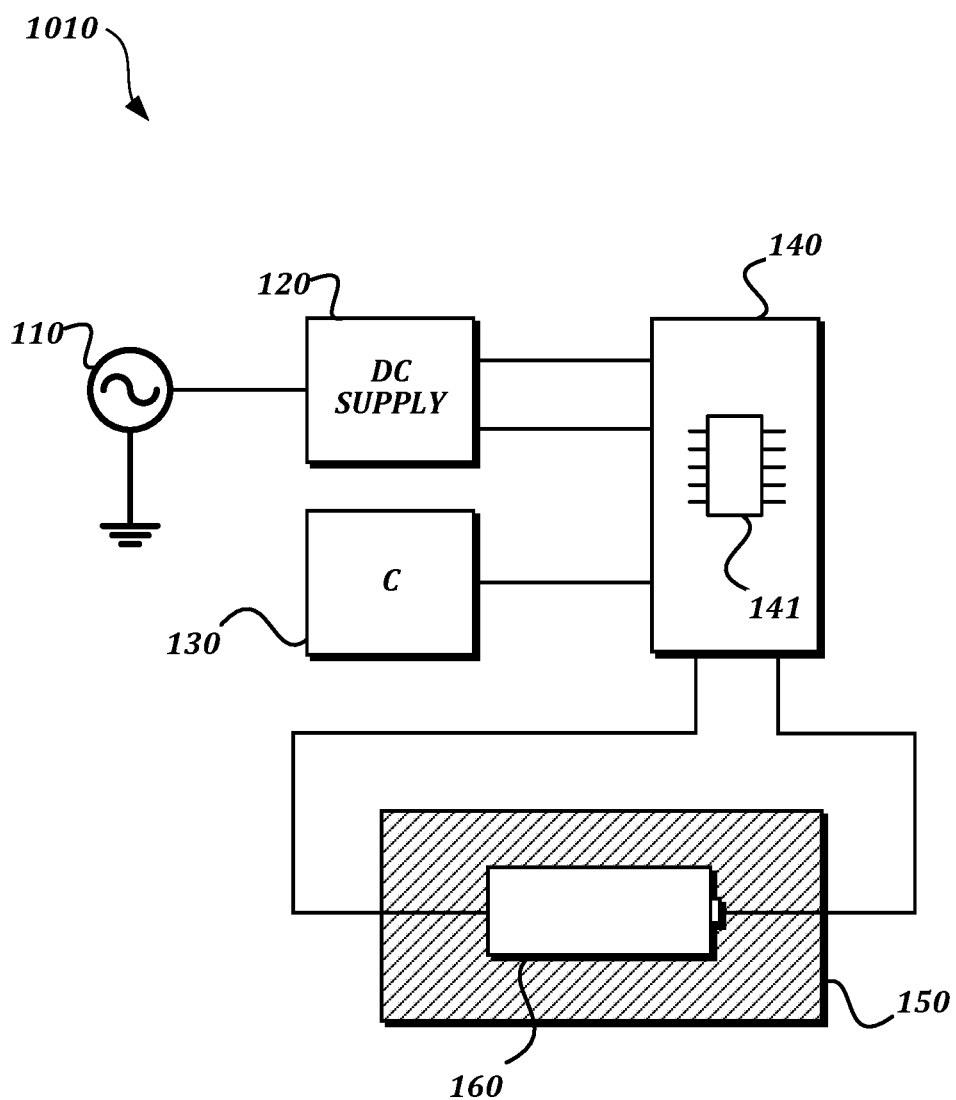
FIG. 1 is a partially schematic view of an example of a battery management system in accordance with an example embodiment of the presently disclosed technology.

FIG. 1 is a partially schematic view of an example of a battery management system 1010 in accordance with an example embodiment of the presently disclosed technology. In some embodiments, the battery management system 1010 may include a power supply 110 and a DC supply 120 that provides power to an electronics board 140. The electronics board 140 may include several components including a programmable chip 141 (e.g., an EPROM). A battery charging housing 150 may include at least one rechargeable battery 160. In some embodiments, the battery charging housing may be replaced by connectors that are electrically connected to the electronics board 140 with conductive wires.

The operation of the DC supply 120 and/or the electronics board 140 may be controlled by a controller 130. For example, the controller 130 may load data onto the programmable chip 141 that, in turn, controls the DC supply 120. The data loaded by the controller 130 onto the programmable chip 141 may include one or more parameters for a model that describes, for example, charging/discharging, heating, cycling, etc., for the rechargeable batteries. For example, data (e.g., parameters) obtained by one or more of the techniques described below may be used to control charging/discharging current, charging/discharging voltage, temperature of the battery, peak efficiency of the battery, optimal number of charging/discharging cycles, etc., of the battery 160 through the controller 130 and/or programmable chip 141. In some embodiments, the controller 130 may control the DC supply 120 directly. In some embodiments, the controller 130 may be part of (e.g., may be carried by) the electronics board 140.

A single battery 160 is illustrated and described herein for the sake of simplicity. However, in some embodiments, the battery management system 1010 may support using more than one battery 160. If more than one battery 160 is used, then there may be a separate controller 130 or programmable chip 141 associated with each battery, or a single controller 130 or programmable chip 141 may manage all of the batteries 160. One of ordinary skill in the art will recognize that the battery management system 1010 illustrated in FIG. 1 is an example only, and will recognize that the techniques described herein may be used in other types of devices that are used to control charging and/or discharging of a battery without departing from the scope of the present disclosure.

Figure 2:
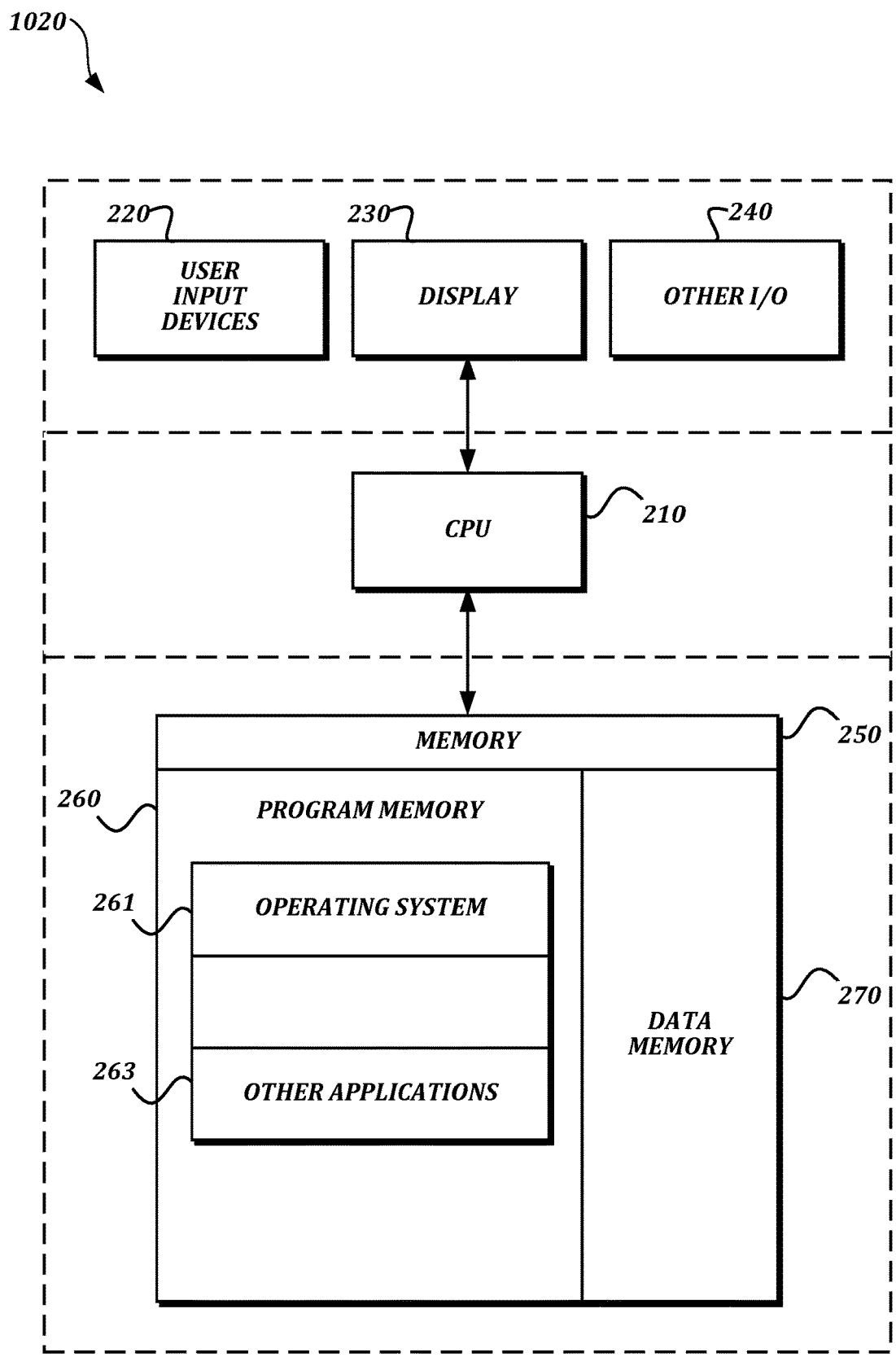
FIG. 2 is a block diagram of a controller 1020 (e.g., a computing device) for the battery charging system in accordance with an example embodiment of the presently disclosed technology.

FIG. 2 is a block diagram of a controller 1020 (e.g., a computing device) for the battery charging system in accordance with an example embodiment of the presently disclosed technology. The controller 1020 may be suitable for use as a controller 130 as illustrated in FIG. 1. The controller 1020 includes one or more input devices 220 that provide input to a CPU (processor) 210. Input devices 220 can include, for example, a mouse, a keyboard, a touchscreen, an infrared sensor, a touchpad, wearable input devices, a camera or image-based input device, microphone, or other input devices. The CPU 210 may be a single processing unit or multiple processing units in a device or distributed across multiple devices. The CPU 210 may be coupled to other hardware devices, for example, with the use of a BUS, such as a PCI BUS or SCSI BUS. Further, the CPU 210 may communicate with a hardware controller for devices such as for a display 230. The display 230, for example, may be used to display text and graphics. One example of a suitable display 230 is a touchscreen that provides graphical and textual visual feedback to a user. In some embodiments, the display 230 includes the input devices 220 as part of the display, such as when the input device is a touchscreen. In some embodiments, the display 230 is separate from the input device 220. Examples of standalone display devices include, for example, an LCD display screen, an LED display screen, a projected display (such as a heads-up display device), and so on. Other I/O devices 240 may also be coupled to the CPU 210, such as a video or audio card, USB or other external devices, printer, speakers, CD-ROM drive, DVD drive, disk drives, Blu-Ray devices, battery connection cables, or battery measurement tools. In some implementations, other I/O devices 240 also include a communication device capable of communicating wirelessly or wire-based with a network node. The communication device may communicate with another device or a server through a network using, for example, TCP/IP protocols.

The CPU 210 can access a memory 250. The memory 250 can include one or more hardware devices for volatile and non-volatile storage, and may include both read-only and writable memory. For example, the memory 250 may comprise random access memory (RAM), read-only memory (ROM), writable non-volatile memory, such as flash memory, hard drives, floppy disks, CDs, DVDs, magnetic storage devices, tape drives, device buffers, and so forth. The memory 250 can include non-transitory electrical signals on the underlying hardware. The memory 250 can include program memory 260 that contains programs and software, such as an operating system 261, geotemporal mapper 262, and other application programs 263. The memory 250 also includes data memory 270 that includes any configuration data, settings, user options and preferences that may be needed by the program memory 260. The controller 1020 may include general purpose or special purpose computing system environments or configurations. In some embodiments, the controller 1020 may not include the illustrated user input devices 220 or display 230, but may instead be a component that is accessible programmatically only.

Many embodiments of the technology described below may take the form of computer- or controller-executable instructions, including routines executed by a programmable computer or controller. Those skilled in the relevant art will appreciate that the technology can be practiced on computer/controller systems other than those shown and described below. The technology can be embodied in a special-purpose computer, controller or data processor that is specifically programmed, configured or constructed to perform one or more of the computer-executable instructions described below. The technology can also be practiced in distributed environments, where tasks or modules are performed by remote processing devices that are linked through a communications network. In a distributed computing environment, program modules or subroutines may be located in local and remote memory storage devices. Aspects of the technology described below may be stored or distributed on non-transitory computer-readable media, including magnetic or optically readable or removable computer disks, as well as distributed electronically over networks. Data structures and transmissions of data particular to aspects of the technology are also encompassed within the scope of the embodiments of the technology.

Figure 3A:
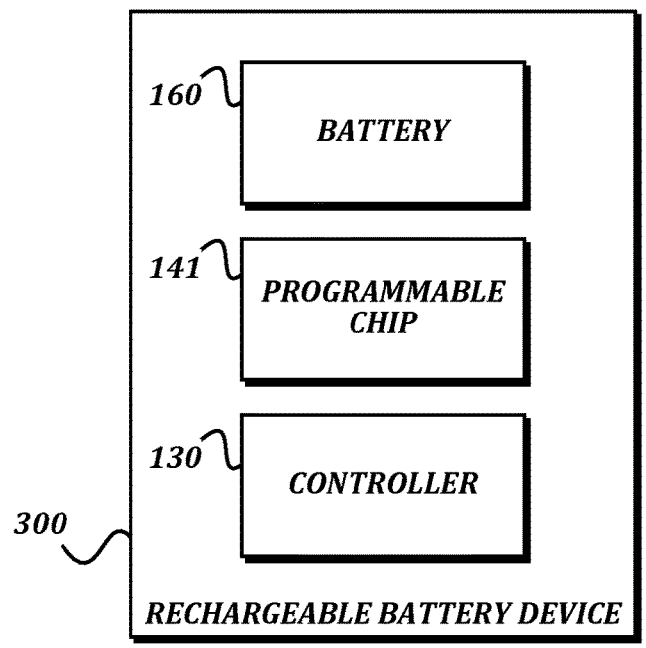
FIGS. 3A and 3B are block diagrams that illustrate example embodiments of the present disclosure as they may be deployed in devices.
Figure 3B:
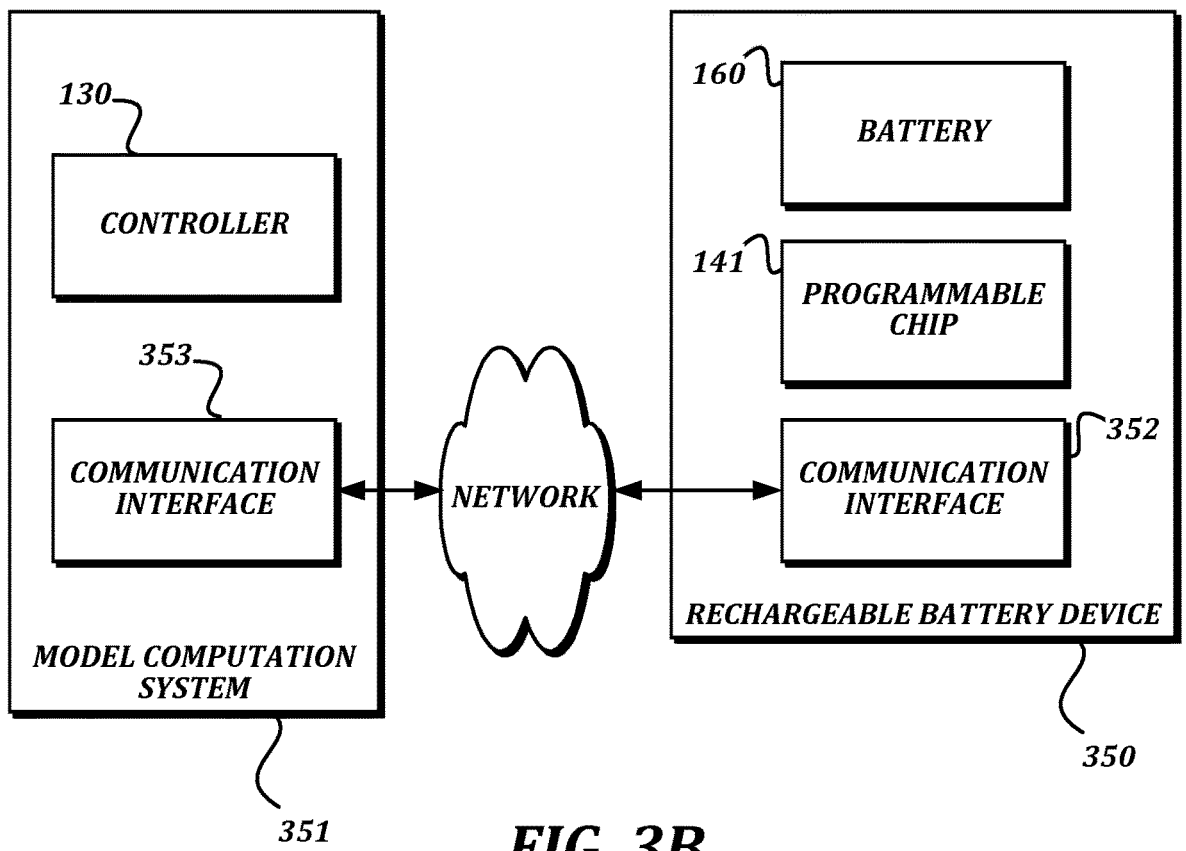

FIGS. 3A and 3B are block diagrams that illustrate example embodiments of the present disclosure as they may be deployed in devices. FIG. 3A illustrates an example of a self-contained rechargeable battery device 300. The rechargeable battery device 300 is self-contained in that the battery controller 130, programmable chip 141, and battery 160 are all enclosed within a single housing. Such an embodiment would include a controller 130 that has adequate computing power to conduct the simulations of the model and to estimate the parameters for use by the programmable chip 141 in controlling the battery 160 as described fully below.

FIG. 3B illustrates an example of a rechargeable battery device 350 that is not self-contained in the same way as the rechargeable battery device 300)) illustrated in FIG. 3A. As shown, the rechargeable battery device 350 has a housing that encloses the battery 160 and the programmable chip 141, but not the battery controller 130. Instead, the housing of the rechargeable battery device 350 encloses a communication interface 352, which is configured to communicate with a corresponding communication interface 353 of a model computation system 351. The model computation system 351 and controller 130 may be implemented using any suitable computing device or devices, including but not limited to a laptop computing device, a desktop computing device, a cluster of computing devices, and one or more computing devices in a cloud computing service.

Communication between the communication interface 352 of the rechargeable battery device 350 and the communication interface 353 of the model computation system 351 may be by any suitable communication technique, including but not limited to wired or wireless Internet communication; wireless communication including but not limited to WiFi, 3G, 4G, LTE, or Bluetooth; and wired communication including but not limited to USB, Firewire, Ethernet, fiber optic, CAN bus, or OBD-II. In use, the rechargeable battery device 350 may measure a discharge curve for the battery 160, and may transmit the discharge curve 160 and any other relevant information (including but not limited to temperature readings) to the model computation system 351. The model computation system 351 may then use its superior computing power to have the battery controller 130 determine parameters for the model of the battery 160 based on the discharge curve and any other relevant information. The parameters are then transmitted back to the rechargeable battery device 350.

Figure 4A:
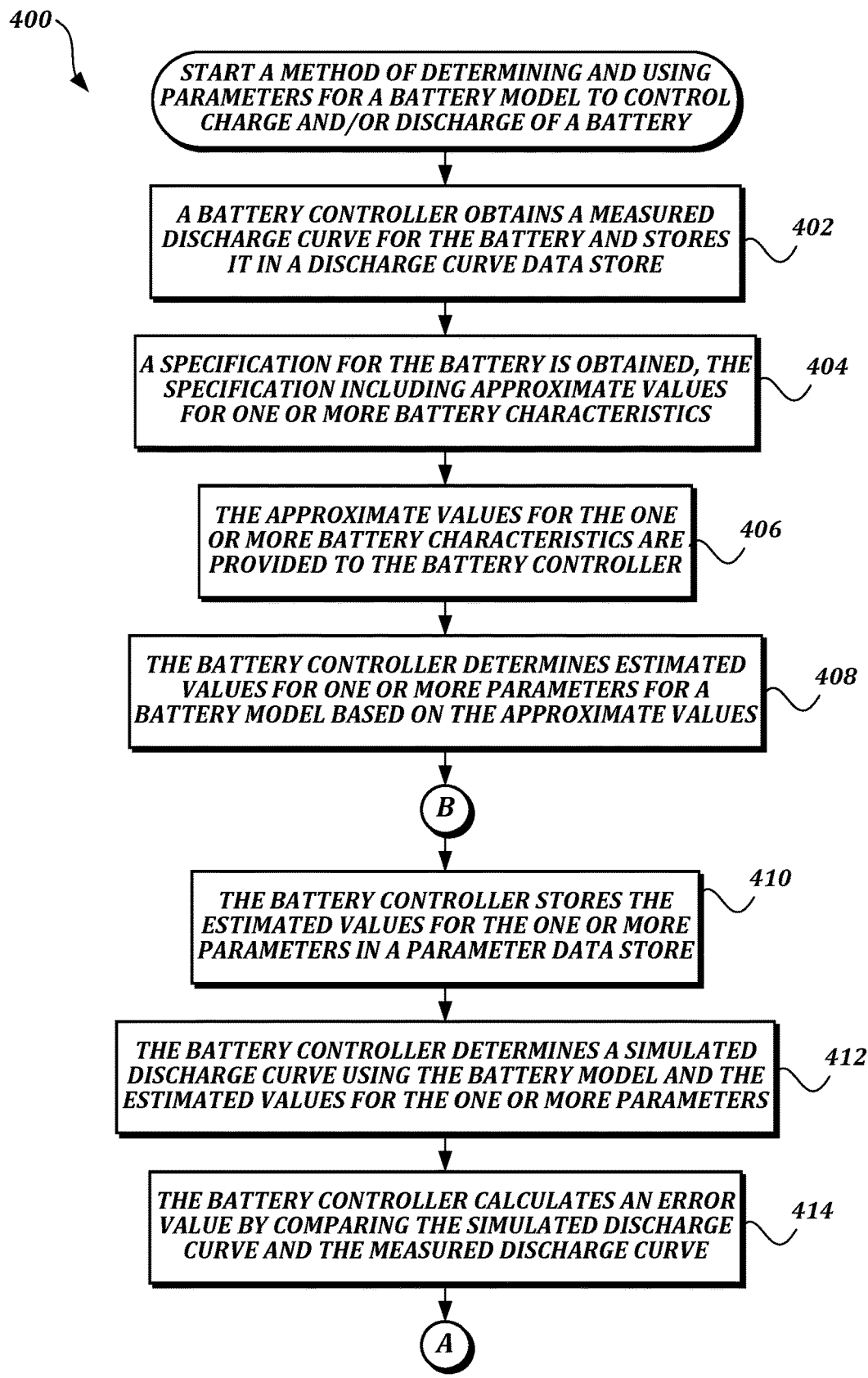
FIGS. 4A and 4B are a flowchart that illustrates an example embodiment of a method of determining and using parameters for a battery model to control charge and/or discharge of a battery according to various aspects of the present disclosure.
Figure 4B:
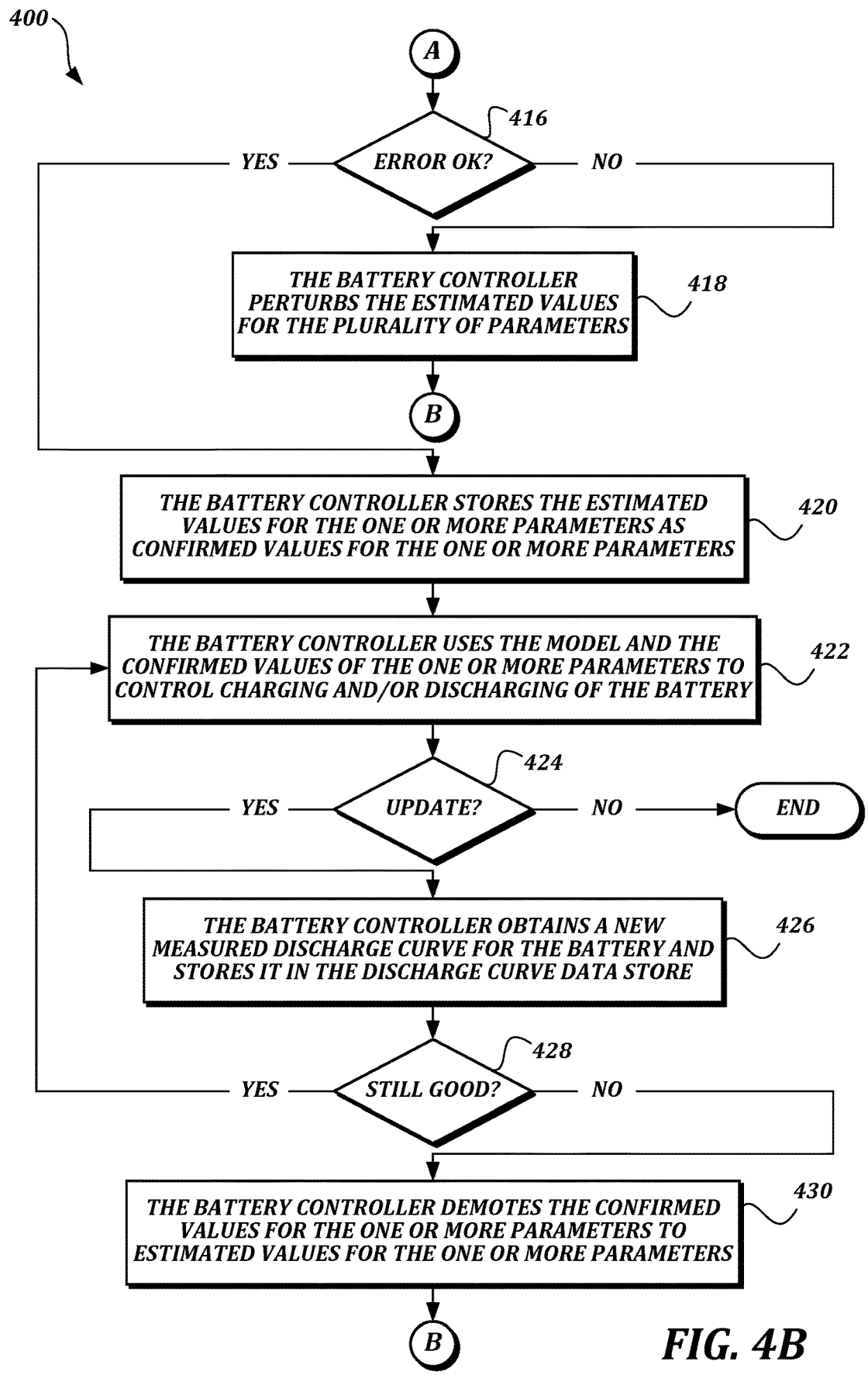

FIGS. 4A and 4B are a flowchart that illustrates an example embodiment of a method of determining and using parameters for a battery model to control charge and/or discharge of a battery according to various aspects of the present disclosure. From a start block, the method 400 proceeds to block 402, where a battery controller 130 obtains a measured discharge curve for a battery 160 and stores it in a discharge curve data store. In some embodiments, the discharge curve may be measured by the battery controller 130, programmable chip 141, or other component of the battery management system 1010. In some embodiments, the discharge curve might be measured by another device and provided to the battery controller 130.

As understood by one of ordinary skill in the art, a "data store" as described herein may be any suitable device configured to store data for access by a computing device. One example of a data store is a relational database management system (RDBMS). However, any other suitable storage technique and/or device capable of organizing and storing the data may be used, such as a key-value store, an object database, and/or the like. Other examples of a data store may also include data stored in an organized manner on a computer-readable storage medium, as described further below. One example of a data store which includes reliable storage, but also low overhead, is a file system or database management system that stores data in files (or records) on a computer-readable medium such as flash memory, random access memory (RAM), hard disk drives, and/or the like. One of ordinary skill in the art will recognize that separate data stores described herein may be combined into a single data store, and/or a single data store described herein may be separated into multiple data stores, without departing from the scope of the present disclosure. In some embodiments, the discharge curve data store may be stored by the data memory 270 of the battery controller 130.

At block 404, a specification for the battery is obtained, the specification including approximate values for one or more battery characteristics. The specification may include data that is common on battery datasheets provided by the manufacturer, including but not limited to a capacity, a weight, a temperature, dimensions, an energy density, charge characteristics (such as as-designed charging curves for various rates of charge), discharge characteristics (such as as-designed discharge curves for various rates of charge), life cycle characteristics, a cut-off voltage, and a cut-off temperature. In some embodiments, the battery controller 130 may be capable of ingesting this information from a data sheet. In some embodiments, the battery controller 130 may retrieve the information from a data store based on a model number or other identifier of the battery 160.

From the specification information, approximate values for some battery characteristics may be derived. For example, physical dimensions of the battery may place an upper bound on a model parameter relating to thickness of a battery component. As another example, the electrode thicknesses and active material sizes generally have a narrow feasible range. As yet another example, the transport parameters are well studied and an educated guess about the range of transport parameters like diffusivity and conductivity can be made. In some embodiments, the determination of approximate values for the battery characteristics may be optional, and default values for all parameters may be used without narrowing the range for any parameters based on the battery characteristics. However, determining at least some battery characteristics may improve the performance of the technique, at least in that the initial estimates for the parameters may be closer to the actual value and may cause the values to converge faster. At block 406, the approximate values for the one or more battery characteristics (if any have been determined) are provided to the battery controller 130. In some embodiments, the datasheet or the approximate values derived therefrom are provided directly to the battery controller 130, and so the approximate values are derived by the battery controller 130 and do not need to be provided in block 406.

Next, at block 408, the battery controller 130 determines estimated values for one or more parameters for a battery model based on the approximate values. Electrochemical models for batteries usually fall into two categories: Single Particle Model (SPM) or Pseudo 2-Dimensional (P2D) model. The P2D model, also known as the Doyle-Fuller-Newman (DFN) model or porous electrode model, was developed by the Newman group in the 1990s, which takes into account the porous electrode theory, concentrated electrolyte theory, Ohm's law, charge and material balance, and reaction kinetics. The SPM was introduced into lithium-ion battery modeling later by the White group in the 2000s. The SPM is simpler compared to the P2D model but still captures the main physical processes in battery cells, including diffusion in the solid phase, reaction kinetics at the solid-electrolyte interphase, and material and charge balance.

For the SPM, ten parameters may be used:

| Parameter Symbol | Parameter Description |
| --- | --- |
| $Ds_i$ | Diffusivity |
| $k_i$ | Reaction rate constant |
| $L_i$ | Electrode thickness |
| $\varepsilon_i$ | Electrode porosity |
| $R_i$ | Particle size (positive) |

To these parameters, the present techniques also add the open circuit potential. The open circuit potential is also referred to as a thermodynamic parameter, the diffusivity values ($Ds_p$, $Ds_n$) are also referred to as transport parameters, the reaction rate constants ($k_p$, $k_n$) are also referred to as kinetic parameters, and the remainder of the parameters ($L_p$, $L_n$, $\varepsilon_p$, $\varepsilon_n$, $R_p$, and $R_n$) are also referred to as design parameters.

The method 400 then proceeds to a continuation terminal ("terminal B"), and then to block 410, where the battery controller 130 stores the estimated values for the one or more parameters in a parameter data store. Again, the parameter data store may be stored in the data memory 270 or in any other suitable location.

At block 412, the battery controller 130 determines a simulated discharge curve using the battery model and the estimated values for the one or more parameters. Any suitable technique for solving the model may be used. In some embodiments, a finite difference method or collocation method may be applied for special discretization. For this method, the more node points used, the more accurate the solution is, but the more computational cost is required. As shown in the results section below, simulations with 5, 10, 15, and 20 node points for the finite difference method were tested. The results suggest that at least 10 points should be used for accurate simulation. In some embodiments, a least squares estimation approach may be used to minimize the sum of squared differences between the experimental data and the model predictions. An example objective function that may be used for this is:

$$\min \sum_{t_0=0}^{t_n=t_f} [V_{exp}(t_i) - V_{model}(t_i)]^2$$

In some embodiments, other techniques may be used to solve the model, including but not limited to techniques described in commonly owned, co-pending PCT Application PCT/US2016/043188, filed Jul. 20, 2016, the entire disclosure of which is hereby incorporated by reference for all purposes.

Next, at block 414, the battery controller 130 calculates an error value by comparing the simulated discharge curve and the measured discharge curve. In some embodiments, a mean absolute error may be determined for the error value, using a formula such as:

$$\text{Mean Absolute Error} = \frac{\left|\sum_{i=1}^{n} V(i) - V_{expt}(i)\right|}{n}$$

The method 400 then proceeds to a continuation terminal ("terminal A"). From terminal A (FIG. 4B), the method 400 proceeds to a decision block 416, where a determination is made regarding whether the error between the simulated discharge curve and the measured discharge curve is acceptable. In some embodiments, the determination may include comparing the determined error to a predetermined threshold error value. In some embodiments, the determination may include determining whether the determined error has continued to decline when compared to previous determinations, or whether the determined error is not improving any further.

If it is determined that the error between the simulated discharge curve and the measured discharge curve is not acceptable, then the result of decision block 416 is NO, and the method 400 proceeds to block 418, where the battery controller 130 perturbs the estimated values for the plurality of parameters. Perturbing the estimated values may use any suitable technique to iteratively approach more accurate values. In some embodiments, a genetic algorithm (GA) may be used. A GA is a global optimizer based on the process of natural selection and biological evolution. At every step (generation), a certain number (population) of individual solutions are randomly selected by mutation, crossover, and selection from the previous generation. A tool such as the Global Optimization Toolbox in MATLAB may be used to implement such a GA to perturb the estimated values on a computing device such as a desktop computer, laptop computer, or cloud computing service. In some embodiments, a more efficient implementation of GA (such as in C, Fortran, or other lower-level programming language) may be used on a microcontroller.

In some embodiments, the perturbation of a given estimated value may be guided by a predetermined specified range of plausible values established for the given estimated value, including the internal variables like lithium-ion concentration that cannot be measured directly. For example, it may be specified that the parameter for thickness is in a range that is smaller than the thickness provided in the battery characteristics, and is greater than zero. The use of predetermined specified ranges can help reduce the amount of time that it takes to approach accurate values for each of the parameters. In some embodiments, the perturbation of a given estimated value may be guided by determining a direction of the error, and which direction the estimated value should be moved to reduce the error. For example, if it is determined that a data point generated by the model is below a value in the measured discharge curve, and that increasing an estimated value would increase the value of the data point generated by the model, then the estimated value would be increased during the perturbation. Similarly, some embodiments may determine whether the error is getting larger or smaller after the estimated value is perturbed in a given direction, and may continue perturbing the estimated value in that direction if it is getting smaller, and may perturb the estimated value in the other direction if it is getting bigger. The method 400 then returns to terminal B to simulate a discharge curve with the perturbed parameters.

Otherwise, if it had been determined that the error between the simulated discharge curve and the measured discharge curve is acceptable, then the result of decision block 416 is YES, and the method 400 proceeds block 420, where the battery controller 130 stores the estimated values for the one or more parameters as confirmed values for the one or more parameters. The confirmed values may be stored in the parameter data store described above, or in any other computer-readable medium accessible by the battery controller 130. At block 422, the battery controller 130 uses the model and the confirmed values of the one or more parameters to control charging and/or discharging of the battery 160. In some embodiments, the battery controller 130 provides the model, the confirmed values, or both to the programmable chip 141, and the programmable chip 141 controls charging and/or discharging of the battery 160.

The method 400 then proceeds to decision block 424, where a determination is made regarding whether the model should be updated. In some embodiments, the model and the parameters may be updated every charge/discharge cycle, once a new charge curve or discharge curve is obtained. In some embodiments, the model and the parameters may be updated after an elapsed period of time. In some embodiments, the model and the parameters may be updated in response to a user request. In some embodiments, the determination of when to update the model and parameters may be user configurable.

If the model should be updated, then the result of decision block 424 is YES, and the method 400 proceeds to block 426, where the battery controller 130 obtains a new measured discharge curve for the battery 160 and stores it in the discharge curve data store. In some embodiments, the new measured discharge curve may be obtained by taking measurements during the charge/discharge cycle of normal use. In some embodiments, the new measured discharge curve may be generated during a special charge/discharge cycle that is performed at a constant rate. In some embodiments, the new measured discharge curve may be obtained by a separate testing device and then provided to the battery controller 130.

The method 400 then proceeds to a decision block 428, where a determination is made regarding whether the model and the one or more parameters still accurately represent the performance characteristics of the battery 160. This determination may be based on a comparison of an error value to a threshold, as discussed above in block 414. If the amount of error remains acceptable and the model is therefore still good, then the result of decision block 428 is YES, and the method 400 returns to block 422. Otherwise, if the amount of error is too high and the model is therefore no longer good, then the result of decision block 428 is NO, and the method 400 proceeds to block 430. At block 430, the battery controller 130 demotes the confirmed values for the one or more parameters to estimated values for the one or more parameters. The method 400 then returns to terminal B to recompute the one or more parameters.

Returning to decision block 424, if the model should not be updated, then the result of decision block 424 is NO, and the method 400 terminates.

Case Studies

Several case studies were conducted for estimating OCP of positive electrode and other parameters in the model. A linear model for the OCPs of the positive electrode was used in the studies. A certain number of OCP values at specified SOCs, and a linear relationship was used for the SOCs between pairs of values, as expressed in the following equation:

$$U_{i+1,j} = U_{i,j} + (U_{i+1,j} - U_{i,j}) \times \frac{\theta_j^s - \theta_{i,j}^s}{\theta_{i+1,j}^s - \theta_{i,j}^s}, \forall\ i = 1\infty$$

The experimental data was collected by discharging a fully charged Panasonic NCR18650A cell to 2.5 V at constant rates. The experimental data was recorded every second, resulting in ~3600 data points for 1 C discharge. To reduce the number of data points, we used 1 point for every 10 s, thus for 1 C discharge, the number of data points was ~360. The typical nominal capacity of the cell is 3070 mAh. The chemistry of the cell is not disclosed in its datasheet other than that it uses a nickel oxide system. All of the case studies were performed based on a single discharge curve at 3000 mA at room temperature, roughly 1 C. For the parameters not estimated in a certain case, we are using +−1% of the respective values in the 7th column of Table 2.2 as bounds, and estimating at the same time, thus the total numbers of parameter to be estimated are the same (31) for all cases.

All the estimations below were run on a Dell Precision T7500 desktop with two Intel Xeon CPU W5590 3.33 GHz processors and 24 GB RAM. The Global Optimization Toolbox in MATLAB R2015b in a Windows 7 Professional 64-bit system was used. The estimation time was under 10 hours for all four cases. Faster computation could be achieved through the use of cloud computing systems as described above.

Case Study 1: Estimation of OCP of Positive Electrode and Resistance

Figure 5:
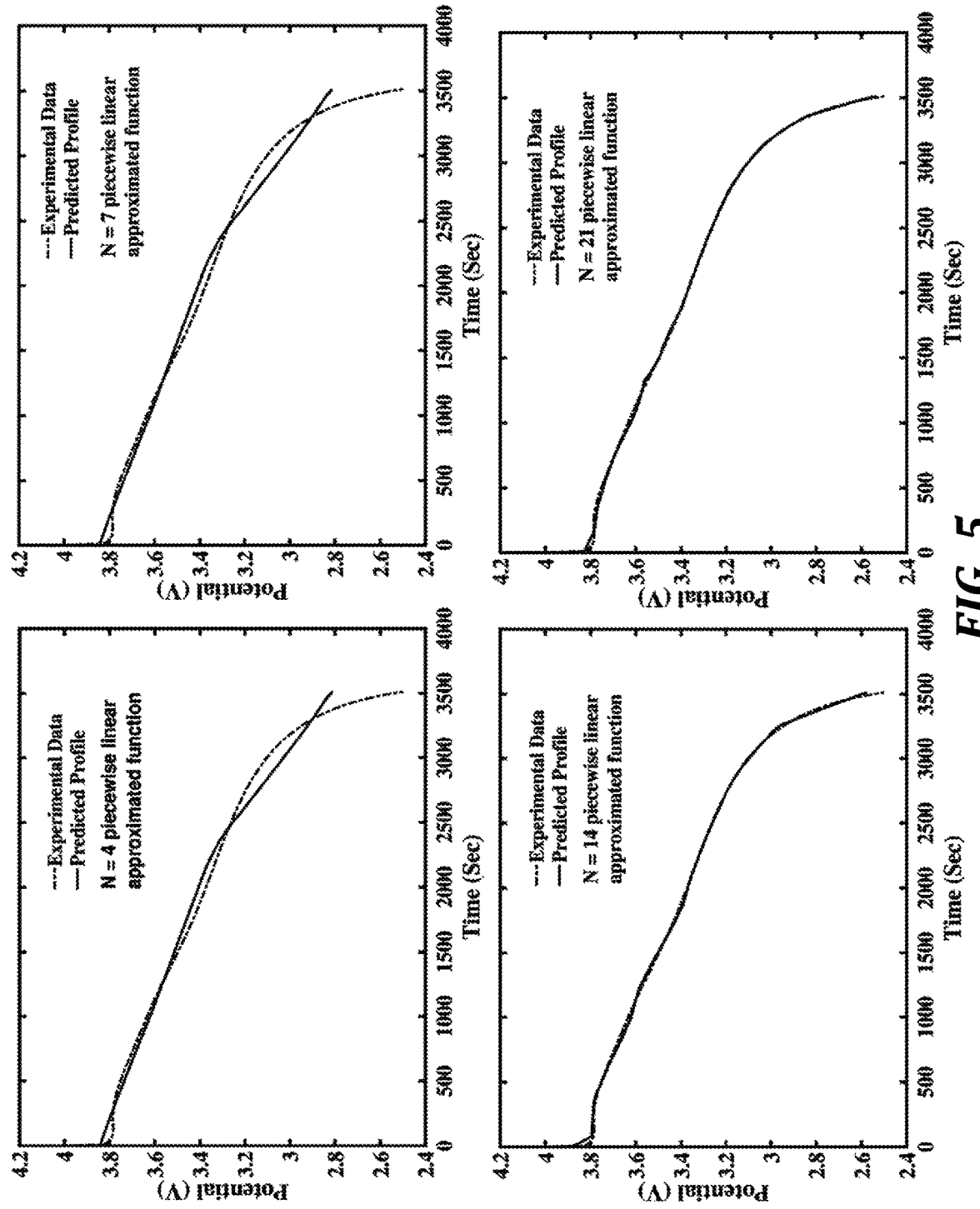
FIG. 5 includes charts that illustrate estimation with 4, 7, 13, and 21 OCP values of the positive electrode.

Theoretically, in the equation above, when n is getting closer to infinity, the linear model is the same as the real case, but with a bigger n, the computational cost increases. We did the estimation with 4, 7, 13, and 21 OCP values of positive electrode, and have illustrated the results in FIG. 5. For the case studies, 21 values were chosen, because 21 points can give us a smooth and accurate enough discharge curve without an unaffordable computational expense.

The first case study uses the linear model to approximate OCP of the positive electrode. In this case, 21 points of OCP and the contact resistance were estimated using GA for SP model. The upper and lower bounds for the OCP values were 2.5 V to 4.4 V. Another constraint was added for the OCP values such that they decrease as the SOC of the positive electrode increases, demonstrated in the following equation:

$$Up_{n+1} - Up_n \leq 0$$

The upper and lower bounds for R were 0.2Ω and 0.01Ω. No additional information about the electrode chemistry was required for the optimization. The estimated OCP values were listed in the second column of Table 2.1 and plotted in FIG. 6, while the discharge curve with estimated values can be found in FIG. 7.

TABLE 2.1

| SOC | Case1 | Case2 | Case3 | Case4 | Li$_y$Ni0.6Co0.2Mn0.2O2[10] |
|---|---|---|---|---|---|
| 0.4 | 4.3464 | 4.369989257 | 4.378048843 | 4.323072203 | 4.219509307 |
| 0.43 | 4.145 | 4.140727144 | 4.312005303 | 4.117938301 | 4.160536369 |
| 0.46 | 4.0884 | 4.096664233 | 4.261307772 | 4.065991673 | 4.104341141 |
| 0.49 | 4.0687 | 4.066339986 | 4.211730865 | 4.052920373 | 4.050403904 |
| 0.52 | 4.0359 | 4.022854483 | 4.161307758 | 4.01638027 | 3.998289339 |
| 0.55 | 3.9966 | 3.985739008 | 4.111934602 | 3.957963731 | 3.947870347 |
| 0.58 | 3.9445 | 3.942810635 | 4.062005303 | 3.931656102 | 3.899705117 |
| 0.61 | 3.889 | 3.892814072 | 4.012152941 | 3.864245232 | 3.855425182 |
| 0.64 | 3.8676 | 3.830109916 | 3.961786531 | 3.829605863 | 3.817535193 |
| 0.67 | 3.7959 | 3.79085294 | 3.912423843 | 3.752775047 | 3.787946491 |
| 0.7 | 3.7594 | 3.740805119 | 3.861314123 | 3.717424988 | 3.766141759 |
| 0.73 | 3.6984 | 3.68161019 | 3.812174256 | 3.666763935 | 3.749290956 |
| 0.76 | 3.6613 | 3.641084353 | 3.762710203 | 3.635575487 | 3.734261996 |
| 0.79 | 3.6311 | 3.615505129 | 3.712897752 | 3.595143106 | 3.719075469 |
| 0.82 | 3.5805 | 3.563430737 | 3.663692959 | 3.538127463 | 3.702928445 |
| 0.85 | 3.5373 | 3.514910551 | 3.610132329 | 3.496631836 | 3.68561938 |
| 0.88 | 3.4841 | 3.461853964 | 3.560271627 | 3.434113624 | 3.66700967 |
| 0.91 | 3.4139 | 3.390614046 | 3.509807948 | 3.351897228 | 3.646497048 |
| 0.94 | 3.3173 | 3.285709317 | 3.407893519 | 3.230883049 | 3.621696597 |
| 0.97 | 3.1506 | 3.068522404 | 3.239287855 | 2.968435316 | 3.579731126 |
| 0.99 | 2.7847 | 2.641094113 | 2.857889393 | 2.625952316 | 3.464987318 |

Figure 7:
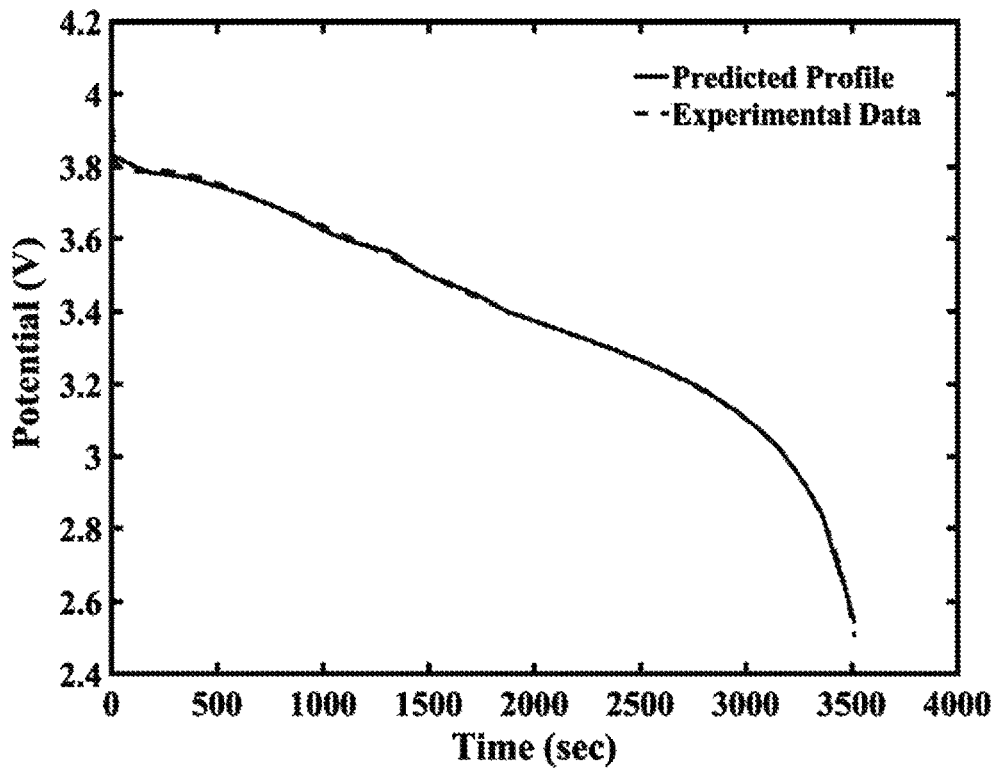
FIG. 7 is a chart that illustrates a discharge curve and estimated values as determined in the first case study.

As can be seen from FIG. 7, the estimated curve matches well with the experimental data, suggesting that the linear approximation approach is applicable to OCP of positive electrode.

Case Study 2: Estimation of OCP of Positive Electrode and Transport Parameters

Figure 6:
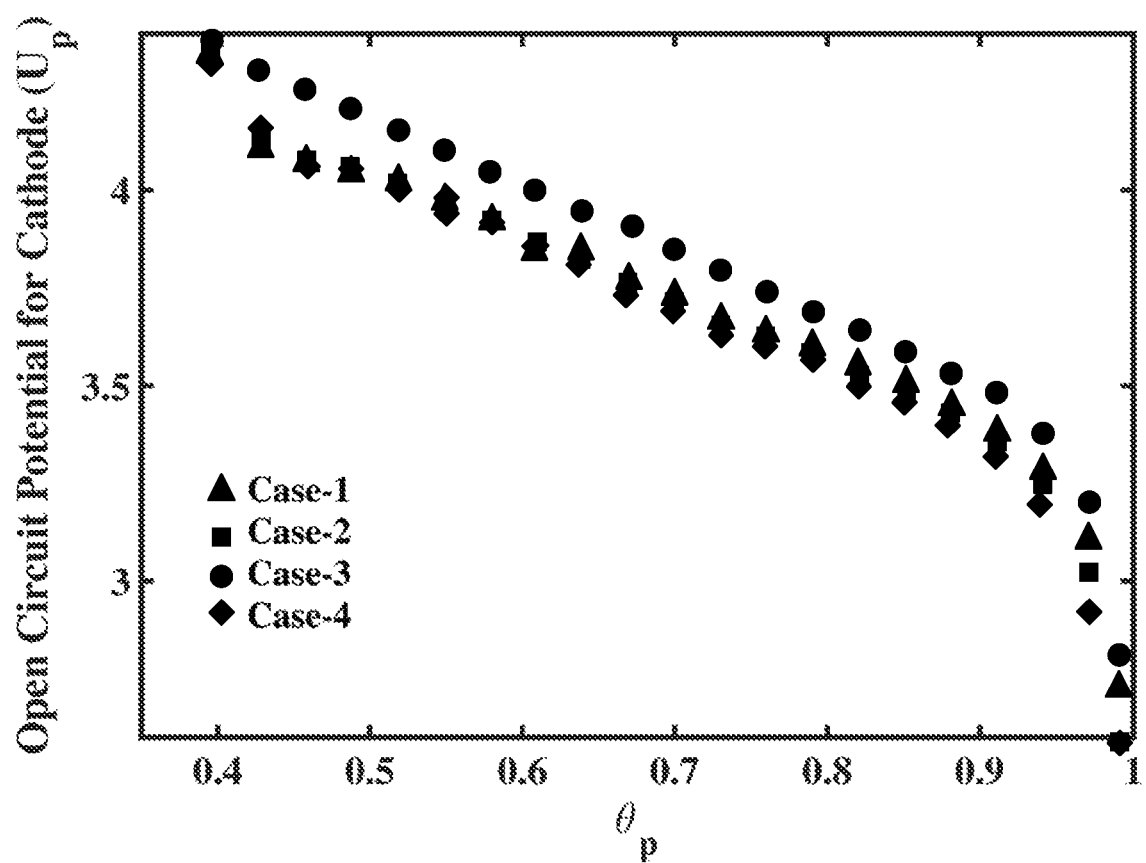
FIG. 6 is a chart that plots the estimated OCP values listed in Table 2.1 for the case studies.
Figure 8:
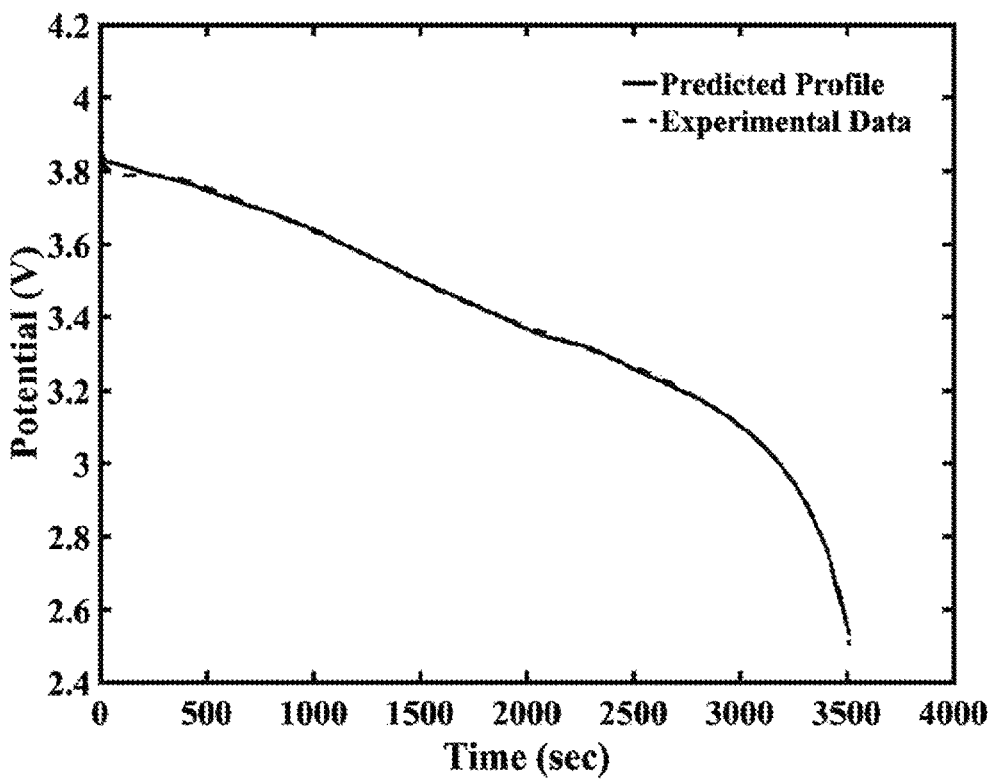
FIG. 8 is a chart that illustrates a discharge curve and estimated values as determined in the second case study.

With the success of case 1, the next step would be to increase the number of parameters actually estimated. The transport and kinetic parameters are harder to measure, thus we estimated them together with the OCP first. For case 2, we set the resistance to be 0.0615Ω from case 1, and estimated 21 OCP values with transport parameters. The bounds for $Ds_p$ and $Ds_n$ were given as 3.34e-13 m²/s to 1e-12 m²/s and 1e-12 m²/s to 3e-12 m²/s. The results are shown in FIGS. 6, 8, and Tables 2.1 and 2.2.

compared to higher rates (2C), this may result from the limitation of SP model. Since the lithium-ion concentration gradient in the electrolyte is ignored in the SP model, it is only valid under low rates.

Validation

Figure 11:
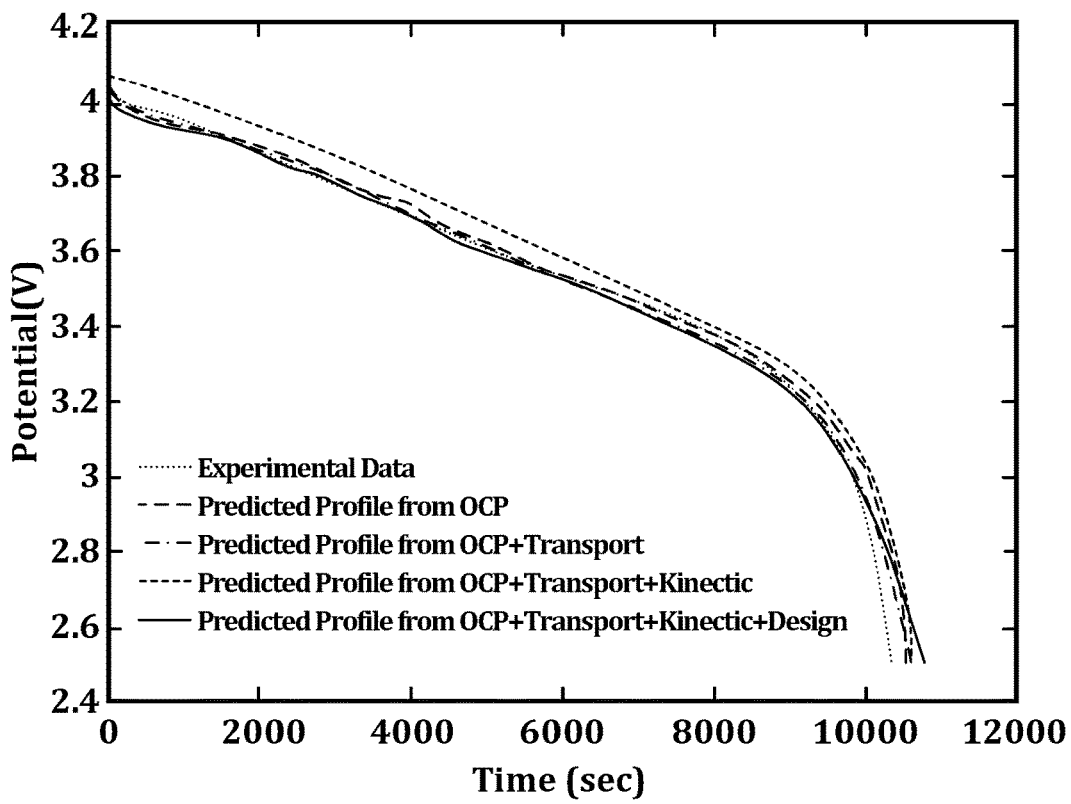
FIG. 11 is a chart that illustrates simulated discharge behavior compared with experimental data at a 1000 mA (C/3) discharge rate.
Figure 12:
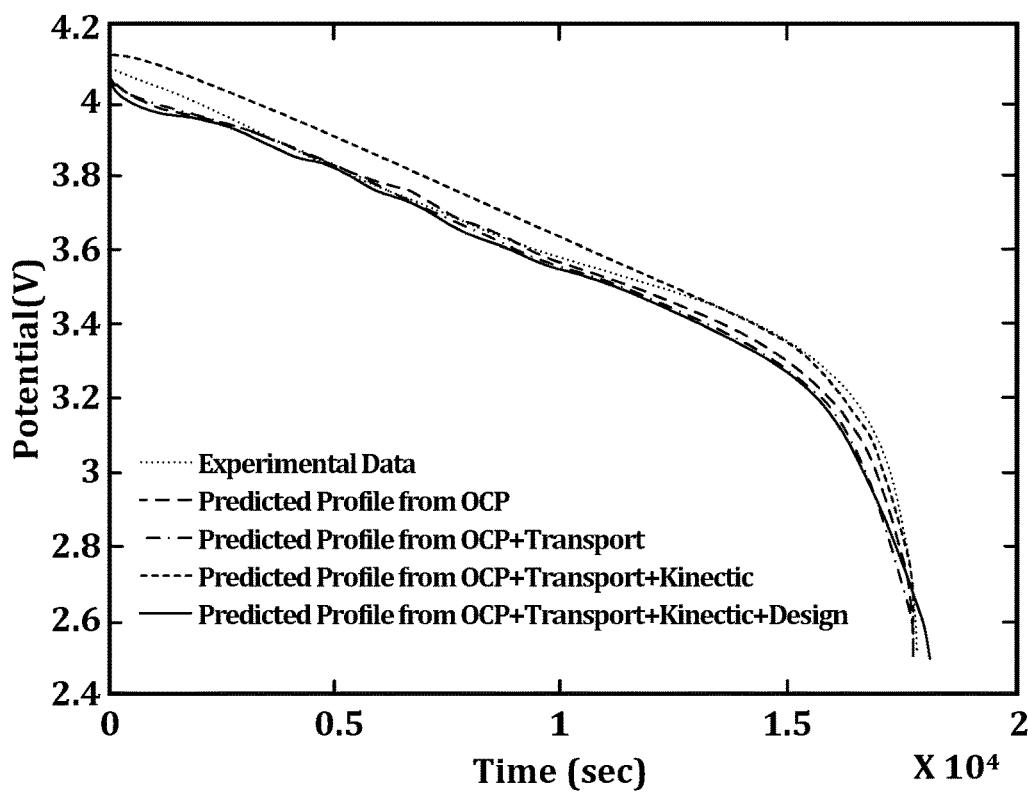
FIG. 12 is a chart that illustrates simulated discharge behavior compared with experimental data at a 600 mA (C/5) discharge rate.
Figure 13:
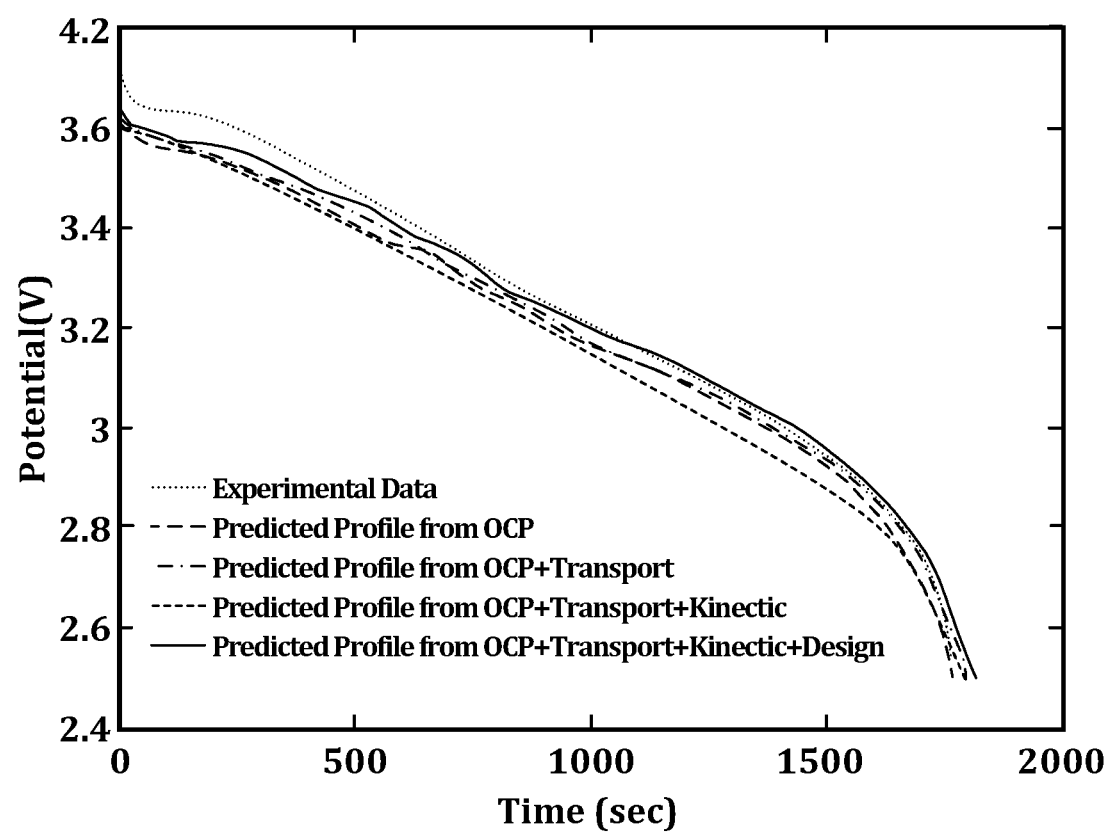
FIG. 13 is a chart that illustrates simulated discharge behavior compared with experimental data at a 6000 mA (2C) discharge rate.

To validate the estimated parameter values got from aforementioned cases, we simulated the discharge behavior at different rates, and compared with experimental data, as shown in FIG. 11 (1000 mA, C/3), FIG. 12 (600 mA, C/5), and FIG. 13 (6000 mA, 2C). As can be observed from the plots, the general discharge performance of the battery under different discharge rates can be predicted reasonably well by our estimated parameters.

Estimation with two discharge curves at different rates might help with the predictability, but using more data

TABLE 2.2

| | | Unit | Case 2 | Case 3 | Case 4 | Base Case | Reported in Appiah |
|---|---|---|---|---|---|---|---|
| Transport | $D_p{}^s$ | m² s⁻¹ | 6.7108e-13 | 3.4832e-13 | 3.3643e-13 | 6.6756e-13 | 9.98e-13 |
| Parameters | $D_n{}^s$ | m² s⁻¹ | 2.6174e-12 | 1.0211e-12 | 1.0084e-12 | 2.0085e-12 | 1.57e-14 |
| Kinetic | $k_p$ | m^{2.5}mol^{-0.5}s⁻¹ | — | 3.4710e-11 | 3.8245e-11 | 1.334e-10 | 3.94e-11 |
| Parameters | $k_n$ | m^{2.5}mol^{-0.5}s⁻¹ | — | 1.0046e-10 | 3.7320e-11 | 1.0307e-10 | 3e-11 |
| Design | $R_P$ | μm | — | — | 2.4 | 8 | 4.5 |
| Parameters | $R_n$ | μm | — | — | 2.8 | 10 | 10.5 |
| | $l_p$ | μm | — | — | 37.4 | 43 | 30 |
| | $l_n$ | μm | — | — | 50.9 | 46.5 | 54 |
| | $\varepsilon_p$ | — | — | — | 0.3279 | 0.423 | 0.2 |
| | $\varepsilon_n$ | — | — | — | 0.5158 | 0.413 | 0.37 |

Figure 9:
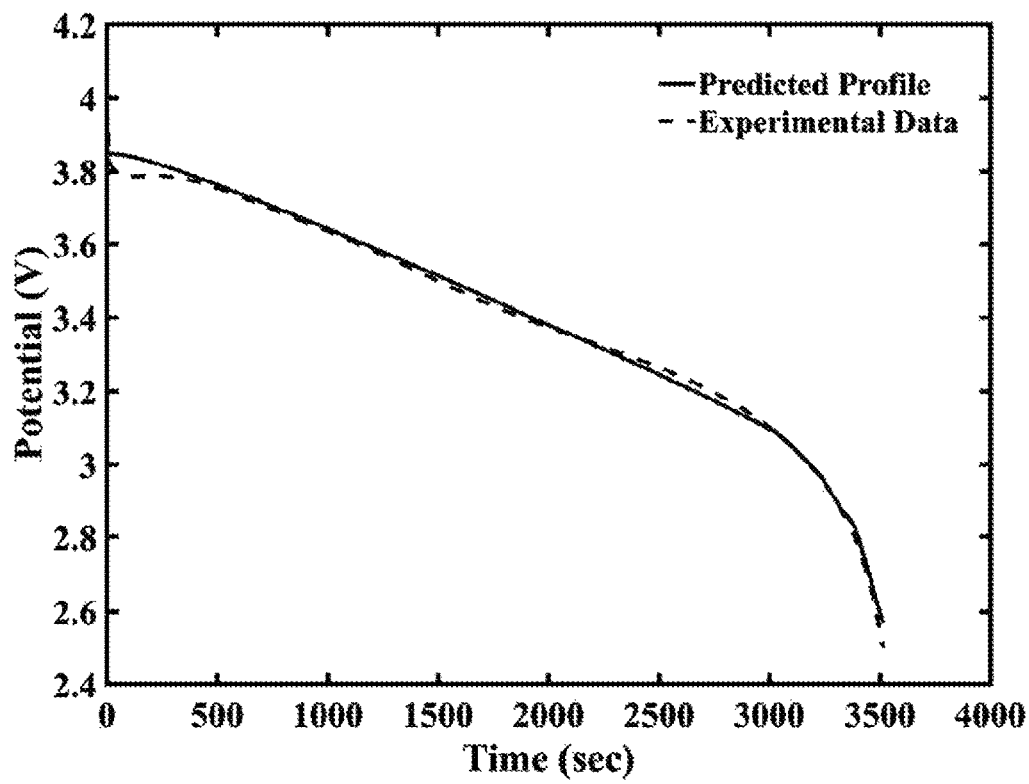
FIG. 9 is a chart that illustrates a discharge curve and estimated values as determined in the third case study.

Case Study 3: Estimation of OCP of Positive Electrode, Transport and Kinetic Parameters We included the kinetic parameters together with OCP values and transport parameters in this case. The bounds for $Ds_p$ and $Ds_n$ were given as 3.34e-13 m²/s to 1e-12 m²/s and 1e-12 m²/s to 3e-12 m²/s. The bounds for $k_p$ and $k_n$ were 6.67e-12 m^{2.5}/(mol^{0.5}s) to 3e-10 m^{2.5}/(mol^{0.5}s) and 5e-12 m^{2.5}/(mol^{0.5}s) to 2.25e-10 m^{2.5}/(mol^{0.5}s). The estimated discharge curve and parameter values can be found in FIG. 9 and Tables 2.1 and 2.2.

Figure 10:
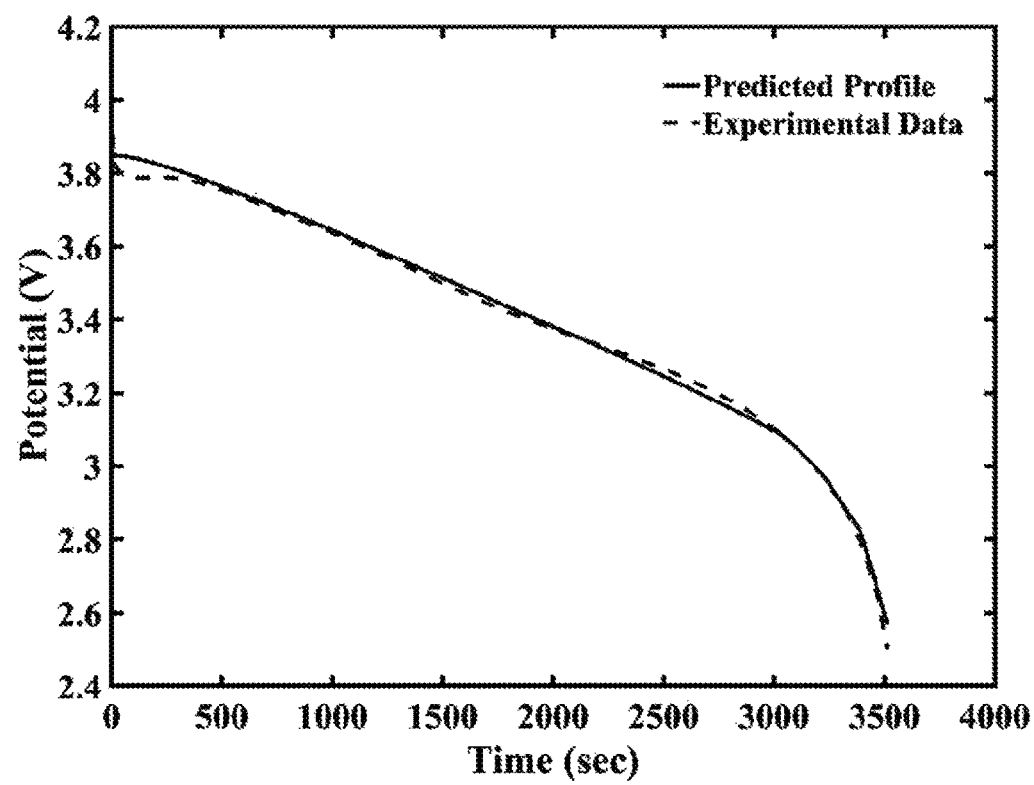
FIG. 10 is a chart that illustrates a discharge curve and estimated values as determined in the fourth case study.

Case Study 4: Estimation of OCP of Positive Electrode, Transport, Kinetic and Design Parameters Finally, in case 4, we estimated OCP and all the parameters with wide bounds for SP model at the same time. The bounds for Ds and $Ds_n$ were the same as in previous cases. The bounds for $k_p$ and $k_n$ were 3.33e-11 m^{2.5}/(mol^{0.5}s) to 1.67e-10 m^{2.5}/(mol^{0.5}s) and 2.58e-11 m^{2.5}/(mol^{0.5}s) to 1.29e-10 m^{2.5}/(mol^{0.5}s). The bounds for $R_p$ and $R_n$ were 2 μm to 10 μm and 2.5 μm to 12.5 μm. While the upper and lower bounds for $\varepsilon_p$ and $\varepsilon_n$ were 0.3 and 0.6. The results are given in FIG. 10 and Tables 2.1 and 2.2.

Error Analysis

The absolute and relevant errors for each case were also calculated, listed in Table 3. The more parameters we estimate at the same time, the greater degree of freedom the solution space has, and thus the smaller error can be achieved compared to the experimental data. Since the parameter values we used in base case were just guesses based on experience, the error incorporated in the parameters, though can be cancelled by varying the parameters we are estimating under this specific condition, may show up under a different operation condition. This is probably what happened in case 3. Even though the error under 3000 mA was smaller compared to case 1 and 2, the prediction for 600 mA, 1000 mA and 6000 mA was further off. In general, the prediction under lower rates (C/5 and C/3) was better means more experiments need to be conducted and more computation need to be run during estimation. Since estimation with one discharge curve can already give us reasonable results under different rate, we will not increase the time and efforts required to get and calculate additional information. However, depending on the application, if higher accuracy is desired, more data points can be easily accommodated in the current optimization framework.

From the foregoing, it will be appreciated that specific embodiments of the technology have been described herein for purposes of illustration, but that various modifications may be made without deviating from the disclosure. For example, one of ordinary skill in the art will recognize that in some areas where discharge curves are discussed, charge curves could be used instead. As another example, in some embodiments, the EPROM chip may be a part of the controller. Moreover, while various advantages and features associated with certain embodiments have been described above in the context of those embodiments, other embodiments may also exhibit such advantages and/or features, and not all embodiments need necessarily exhibit such advantages and/or features to fall within the scope of the technology. Accordingly, the disclosure can encompass other embodiments not expressly shown or described herein.

While illustrative embodiments have been illustrated and described, it will be appreciated that various changes can be made therein without departing from the spirit and scope of the invention.

The embodiments of the invention in which an exclusive property or privilege is claimed are defined as follows:

1. A battery management system, comprising:
   a connector for electrically coupling a battery to the battery management system;
   a programmable chip configured to control charging and discharging of the battery; and a controller device configured to:
  receive approximate values for one or more characteristics of the battery;
  determine a plurality of confirmed values for a plurality of parameters for a model that predicts performance of the battery; and
  provide the plurality of confirmed values for the plurality of parameters to the programmable chip for controlling the charging and discharging of the battery;
wherein the plurality of parameters includes at least one thermodynamic parameter; and
wherein determining the plurality of confirmed values for the plurality of parameters for the model includes:
  determining a plurality of estimated values for the plurality of parameters based on the approximate values for the one or more characteristics of the battery;
  determining a simulated discharge curve using the model with the plurality of estimated values for the plurality of parameters;
  determining an error between the simulated discharge curve and a measured discharge curve for the battery;
  using a genetic algorithm to adjust the plurality of estimated values within specified ranges of plausible values to reduce the error, including adjusting at least one of an estimated diffusivity value (Dsi), an estimated reaction rate constant value (ki), an estimated electrode thickness value (Li), an estimated electrode porosity value ($\epsilon i$), and an estimated particle size value (Ri); and
  using the adjusted plurality of estimated values as the plurality of confirmed values in response to determining that the error has been reduced to an acceptable value;
  wherein the specified ranges of plausible values are based on the received approximate values for the one or more characteristics of the battery.

2. The battery management system of claim 1, wherein the model includes a piecewise linear approximation of open circuit potential with respect to the electrode state of charge.

3. The battery management system of claim 1, wherein the model is a Single Particle Model (SPM).

4. The battery management system of claim 1, wherein using the genetic algorithm to adjust the plurality of estimated values to reduce the error includes:
  determining a direction that a value calculated by the model using at least one estimated value of the plurality of estimated values should move to reduce the error; and
  within the genetic algorithm, adjusting the at least one estimated value to move the value calculated by the model in the determined direction.

5. The battery management system of claim 1, further comprising a housing that encloses the connector, the programmable chip, and the controller.

6. The battery management system of claim 1, further comprising:
  a communication interface; and
  a housing that encloses the connector, the programmable chip, and the communication interface;
  wherein the housing does not enclose the controller; and
  wherein providing the plurality of confirmed values for the plurality of parameters to the programmable chip includes transmitting, by the controller, the plurality of confirmed values for the plurality of parameters to the programmable chip via the communication interface.

7. The battery management system of claim 1, wherein the specified range of plausible values for a given parameter is between the received approximate value for the given parameter and zero.

8. A method of controlling charging or discharging of a battery, the method comprising:
  receiving, by a controller device, approximate values for one or more characteristics of the battery;
  determining, by the controller device, a plurality of confirmed values for a plurality of parameters for a model that predicts performance of the battery; and
  providing the plurality of confirmed values for the plurality of parameters to a programmable chip that controls charging and discharging of the battery;
  wherein the parameter plurality of parameters includes at least one thermodynamic parameter; and
  wherein determining the plurality of confirmed values for the plurality of parameters for the model includes:
    determining a plurality of estimated values for the plurality of parameters based on the approximate values for the one or more characteristics of the battery;
    determining a simulated discharge curve using the model with the plurality of estimated values for the plurality of parameters;
    determining an error between the simulated discharge curve and a measured discharge curve for the battery;
    using a genetic algorithm to adjust the plurality of estimated values within specified ranges of plausible values to reduce the error, including adjusting at least one of an estimated diffusivity value (Dsi), an estimated reaction rate constant value (ki), an estimated electrode thickness value (Li), an estimated electrode porosity value ($\geq i$), and an estimated particle size value (Ri); and
    using the adjusted plurality of estimated values as the plurality of confirmed values in response to determining that the error has been reduced to an acceptable value;
    wherein the specified ranges of plausible values are based on the received approximate values for the one or more characteristics of the battery.

9. The method of claim 8, wherein the model includes a piecewise linear approximation of Up versus positive electrode state of charge.

10. The method of claim 8, wherein using the genetic algorithm to adjust the plurality of estimated values to reduce the error includes:
  determining a direction that a value calculated by the model using at least one estimated value of the plurality of estimated values should move to reduce the error; and
  within the genetic algorithm, adjusting the at least one estimated value to move the value calculated by the model in the determined direction.

11. The method of claim 8, wherein the specified range of plausible values for a given parameter is between the received approximate value for the given parameter and zero.

12. A non-transitory computer-readable medium having computer-executable instructions stored thereon that, in response to execution by at least one processor of a controller device, cause the controller device to perform actions for controlling charging or discharging of a battery, the actions comprising:

receiving, by the controller device, approximate values for one or more characteristics of the battery;

determining, by the controller device, a plurality of confirmed values for a plurality of parameters for a model that predicts performance of the battery; and providing the plurality of confirmed values for the plurality of parameters to a programmable chip that controls charging and discharging of the battery;

wherein the plurality of parameters includes at least one thermodynamic parameter; and wherein determining the plurality of confirmed values for the plurality of parameters for the model includes:

determining a plurality of estimated values for the plurality of parameters based on the approximate values for the one or more characteristics of the battery;

determining a simulated discharge curve using the model with the plurality of estimated values for the plurality of parameters;

determining an error between the simulated discharge curve and a measured discharge curve for the battery;

using a genetic algorithm to adjust the plurality of estimated values within specified ranges of plausible values to reduce the error, including adjusting at least one of an estimated diffusivity value ($D_{si}$), an estimated reaction rate constant value ($k_i$), an estimated electrode thickness value ($L_i$), an estimated electrode porosity value ($\varepsilon_i$), and an estimated particle size value ($R_i$); and using the adjusted plurality of estimated values as the plurality of confirmed values in response to determining that the error has been reduced to an acceptable value;

wherein the specified ranges of plausible values are based on the received approximate values for the one or more characteristics of the battery.

* * * * *